United States Patent [19]

Turney

[11] Patent Number: 4,516,083
[45] Date of Patent: May 7, 1985

[54] FAST LOCK PLL HAVING OUT OF LOCK DETECTOR CONTROL OF LOOP FILTER AND DIVIDER

[75] Inventor: William J. Turney, Schaumburg, Ill.

[73] Assignee: Motorola, Inc., Schaumburg, Ill.

[21] Appl. No.: 378,458

[22] Filed: May 14, 1982

[51] Int. Cl.³ .......................... H03L 7/10; H03L 7/18
[52] U.S. Cl. ....................... 331/1 A; 331/4; 331/16; 331/17; 331/25; 331/DIG. 2; 455/260
[58] Field of Search ............... 331/1 A, 4, 16, 17, 331/25, DIG. 2; 455/260; 328/134

[56] References Cited

U.S. PATENT DOCUMENTS

| | | | |
|---|---|---|---|
| 3,164,777 | 1/1965 | Guanella | 328/134 |
| 3,729,688 | 4/1973 | Cerny, Jr. et al. | 331/1 A |
| 4,135,165 | 1/1979 | Coe | 331/1 A X |
| 4,188,582 | 2/1980 | Cannalte et al. | 325/58 |
| 4,290,029 | 9/1981 | Streckenbach | 331/16 X |
| 4,330,758 | 5/1982 | Swisher et al. | 331/16 X |
| 4,388,598 | 6/1983 | Egan | 331/4 |

FOREIGN PATENT DOCUMENTS 0119867  9/1979  Japan .................................... 331/25

Primary Examiner—Eugene R. LaRoche
Assistant Examiner—D. C. Mis
Attorney, Agent, or Firm—Charles L. Warren; Edward M. Roney; James W. Gillman

[57] ABSTRACT

A phase-locked loop comprises a reference source that produces a signal at a fixed frequency that is applied to a phase detector. That signal is compared in the phase detector with a divided quotient signal that is proportional to the output of a voltage-controlled oscillator. Comparison of the phase difference between the two signals creates an output voltage that is taken to an adaptive filter. The adaptive filter is controlled by an external logic circuit that selects a narrow bandwidth when phase lock is detected and a wider bandwidth when the absence of phase lock is detected. The divisor of the divider in the loop is also changed in response to a signal based on the phase difference. The output of the adaptive filter is taken to a summer which adds a modulating signal to form a combined controlled voltage for the VCO.

14 Claims, 2 Drawing Figures

FAST LOCK PLL HAVING OUT OF LOCK DETECTOR CONTROL OF LOOP FILTER AND DIVIDER

BACKGROUND OF THE INVENTION

This invention relates to radios using frequency synthesizers. In particular, it is a circuit that enables a frequency synthesizer to achieve phase lock in a relatively short time.

A frequency synthesizer for use in a radio transmitter or receiver typically uses a controlled oscillator of some type to generate a signal at a frequency that is processed to provide a desired output. The output signal or some measure of the output signal is compared with a reference signal at a fixed frequency and the comparison is made part of a phase-locked loop to control the output frequency of the controlled oscillator. Several factors combined to place severe demands upon the design of such a circuit. First, it is desirable to make an unambiguous selection of a relatively large number of center frequencies, using only one reference frequency standard. Second, the frequency separation between adjacent channels used for land-mobile communication is normally fixed in a number of bands that vary in frequency by more than a decade. Finally, the trend to the use of higher and higher broadcast frequencies while maintaining the same channel separations places an increased requirement upon the precision of frequency control and the percentage change that must be made to select adjacent frequency channels.

The steps that are taken to solve the preceding problems often lead to another, that of speed of response. This becomes a problem because the objective of the typical phase-locked loop in a synthesizer is to develop a control voltage for a voltage-controlled oscillator (VCO). That control voltage maintains the VCO in phase-locked synchronism with a signal from a reference oscillator at a fixed frequency. Such a steady state is not difficult to maintain. However, when the system is first turned on or when it is desired to change the frequency of the VCO to select a different channel, the system must respond and recover phase lock in an acceptable length of time. That time is a function of the dynamics of the phase-locked loop. It is generally true that the output frequency of the VCO in a phase-locked loop is divided by a large number, of the order of thousands, to be compared with a reference signal to determine phase lock. The reference signal for comparison is typically no greater in frequency than the amount of separation between adjacent channels in the broadcast system and it may be an integral fraction of that separation. When a loop goes out of phase lock, the VCO is normally driven to its high or low extreme of frequency to provide a feedback signal that will recover synchronism. When this extreme is divided by the divisor of the divider in a phase-locked loop, the difference in frequency between the reference frequency and the divided extreme frequency may be as low as 0.1 Hz. This means that the time to change one-half cycle is more than 5 seconds. This is too long to wait for a synthesizer to settle at a new frequency.

The delay thus resulting is further compounded by the fact that it is normally necessary to filter the output of a phase detector that compares the reference frequency with the divided output of the VCO. The output of the phase detector is applied to a low-pass filter that has a cutoff below the reference frequency. The resulting loop dynamics in a typical system can result in a phase-lock time of the order of tens of seconds. Such a time delay is intolerable. A frequency synthesizer should achieve phase lock in a time that is substantially less than a second.

SUMMARY OF THE INVENTION

It is an object of the present invention to provide a phase-locked loop that achieves a fast lock.

It is a further object of the present invention to provide a fast lock in a phase-locked loop that has acceptable loop dynamics for maintaining phase lock. Other objects will become apparent in the course of a detailed description of the invention.

A phase-locked loop comprises a reference source that produces a signal at a fixed frequency that is applied to a phase detector. That signal is compared in the phase detector with a divided quotient signal that is proportional to the output of a voltage-controlled oscillator. Comparison of the phase difference between the two signals creates an output voltage that is taken to an adaptive filter. The adaptive filter is controlled by an external logic circuit that selects a narrow bandwidth when phase lock is detected and a wider bandwidth when the absence of phase lock is detected. The divisor of the divider in the loop is also changed in response to a signal based on the phase difference. The output of the adaptive filter is taken to a summer which adds a modulating signal to form a combined controlled voltage for the VCO.

DETAILED DESCRIPTION OF THE INVENTION

Figure 1:
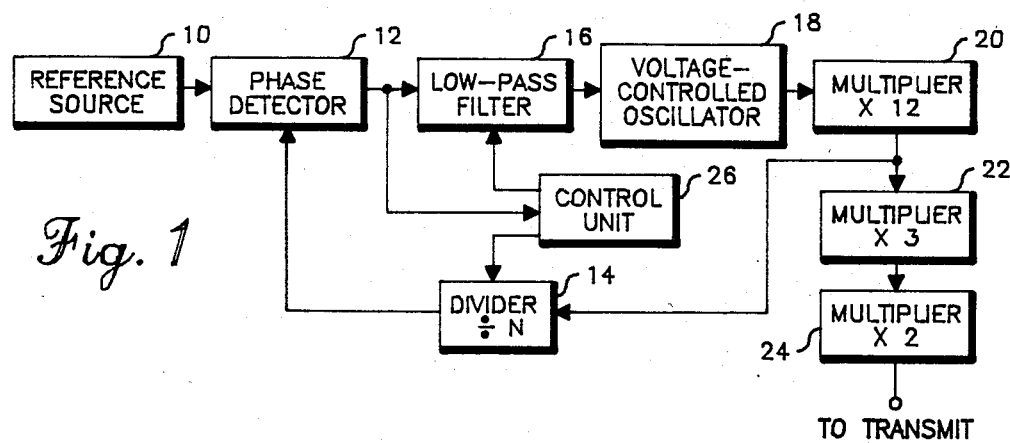
FIG. 1 is a functional block diagram of the circuit of the present invention.

FIG. 1 is a functional block diagram of a circuit for the practice of the present invention. In FIG. 1, a reference source 10 produces a signal at a fixed frequency that is a function of the channel separation that is to be obtained. In this illustrative embodiment the frequency is 2.083.3 Hz, which is 1/12 of the desired channel separation of 25 KHz. The output of reference source 10 is taken to phase detector 12 where it is compared with the output of divider 14. The output of phase detector 12 is taken to low-pass filter 16, which has a cutoff frequency that is less than the output frequency of reference source 10. The output of low-pass filter 16, essentially a DC voltage, is taken as a control voltage to VCO 18. The output of VCO 18, an AC signal at a frequency of the order of 11 to 13 MHz, is taken to multiplier 20, where it is multiplied by twelve to produce a signal at a frequency of the order of 150 MHz. The output of multiplier 20 is taken to divider 14 where it is divided by a number of the order of 73,000. The exact divisor of divider 14 is determined by the desired frequency to be selected but the ratio is selected so that a change of two in the divisor results in a shift of frequency to the next adjacent channel. The output of multiplier 20 is multiplied by 3 in multiplier 22, the output of which is again multiplied by in multiplier 24 to produce a signal in the range of 800 to 960 MHz.

Phase detector 12 can be characterized by a sensitivity parameter stating the output in volts per radian of phase difference between the two inputs. VCO 18 can also be characterized by a parameter describing the output frequency as a function of the applied voltage. These parameters are the principle determiners of the rate at which the frequency of VCO 18 can be changed when the system is in or nearly in phase lock. When the system is out of phase lock, VCO 18 is driven by the control voltage which results from a large phase difference to an extreme value of frequency, either high or low, and the rate at which phase lock is recovered is a direct function of the frequency difference between the divided output of divider 14 and the output of reference source 10. That rate is slowed still further by the delay associated with low-pass filter 16. Typical values of the elements could result in a time delay of as much as seven seconds to achieve phase lock. This is unacceptably long.

The time to achieve phase lock in the circuit of FIG. 1 is reduced by changing parameters of the circuit in response to a signal from control unit 26. Control unit 26 receives one input signal from the output of phase detector 12, and it may receive other inputs, as will be seen later. Outputs from control unit 26 are taken to low-pass filter 16 and to divider 14. The output to low-pass filter 16 raises its cutoff frequency, reducing time delay in the synthesizer. The output to dividier 14 changes its divisor in a proper direction to cause phase lock faster.

The output of VCO 18 is multiplied by twelve in a multiplier 20, which is here shown in the phase-locked loop but which may be outside it. The output of multiplier 20 is multiplied by three in multiplier 22, the output of which is multiplied by two in multiplier 24 to produce a signal at a predetermined frequency for a transmitter.

Figure 2:
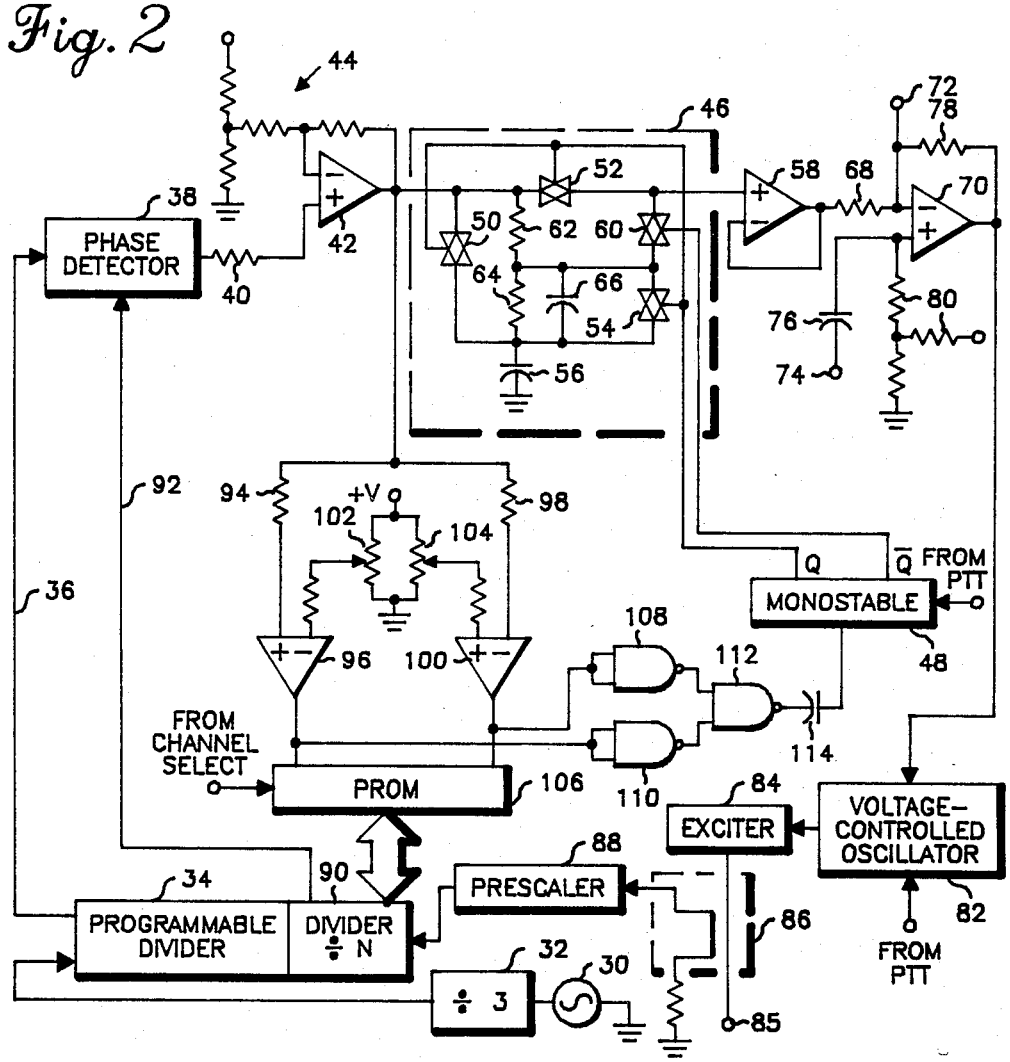
FIG. 2 is a detailed circuit diagram of a circuit for the practice of the present invention.

FIG. 2 is a detailed circuit diagram of a circuit that has been used in the frequency ranges associated with FIG. 1 to achieve phase lock at a time of the order of 150 milliseconds. In FIG. 2 a reference oscillator 30 produces a signal at a frequency of 14.4 MHz. That signal is taken to divider 32 where it is divided by three before it is applied to programmable divider 34. Programmable divider 34 is a Motorola M7718 which is capable of performing two divisions. The first of these divisions divides the output of divider 32 by 2304 to produce pulses at a frequency of 2.083 KHz which is taken on line 36 to phase detector 38. The output of phase detector 38 is applied through a resistor 40 to operational amplifier 42. Negative feedback is applied to operational amplifier 42 by resistive network 44. The output of operational amplifier 42 is applied to adaptive filter 46. Adaptive filter 46 is controlled by monostable 48 which may be triggered by a signal from a push-to-talk (PTT) switch or by another input to be described later. When a PTT switch is closed to start a transmitter, transmission gates 50, 52 and 54 of adaptive filter 46 are closed as long as monostable 48 is in its unstable state, typically hundreds of milliseconds. This places capacitor 56 across the output of operational amplifier 42, charging it rapidly, and connecting operational amplifier 42 directly to the input of operational amplifier 58. When monostable 48 reverts to its stable state, transmission gates 50, 52 and 54 are opened and transmission gate 60 is closed. This connects resistor 62 to the output of operational amplifier 42 and places the parallel combination of resistor 64 and capacitor 66 between resistor 62 and capacitor 56. This changes the time constant of adaptive filter 46.

Operational amplifier 58 is connected as a unity-gain amplifier whose output is taken through resistor 68 to operational amplifier 70. DC modulation such as may result from binary data having a non-zero DC value may be applied to operational amplifier 70 at terminal 72 and AC modulation, such as an analog voice signal, may be applied to operational amplifier 70 at terminal 74 and through capacitor 76. Resistor 78 is a feedback resistor around operational amplifier 70 and resistive network 80 is connected to the positive terminal of operational amplifier 70 to provide a proper bias level. Operational amplifier 70 functions as both an inverter and a summer. The output of operational amplifier 70 is taken to VCO 82. This is the principal frequency source of the synthesizer. In the absence of modulation, VCO 82 is controlled by a voltage from operational amplifier 70 that is essentially DC. Two things cause a change in the controlled voltage applied to the VCO 82. One is modulation and the other is a change to a different channel. Regardless of these changes, the output of VCO 82 is a sinusoidal signal at a frequency of the order of 12.916 MHz. This output is taken to exciter 84 which multiplies the frequency by 12. The output of exciter 84 is taken to terminal 85 where it will go to a doubler, then a tripler, to produce a sinusoid at a frequency of the order of 900 MHz. The output of exciter 84 is also sampled in 30-db coupler 86 which supplies an input at a frequency of the order of 150 MHz to ¾ prescaler 88. The output of ¾ prescaler 88 is taken as an input to divider 90. This is the second part of the programmable divider that was realized as a Motorola 7718. Divider 90 produces an output on line 92 at a frequency of the order of 2.083 KHz. This output is taken to phase detector 38 for comparison with the signal on line 36.

When the circuit of FIG. 2 as described so far has achieved a steady state, the inputs to phase detector 38 on lines 36 and 92 will be at the same frequency and in phase. If they are not in phase, the output of phase detector 38 will produce a voltage that will reach VCO 82 to change the frequency of the output of VCO 82 to set and hold its frequency at a value that will keep the frequencies equal on lines 36 and 92.

The need for the present invention arises from the fact that the output frequencies of VCO 82 can be varied only over a limited range. In normal operation of a transceiver, the output of exciter 84 will operate at a frequency controlled by the VCO and will need to be at different frequencies for different channels. In addition, repeated transmissions within a single channel may lead to a need for repeated recovery or phase lock each time VCO 82 is enabled in response to a signal from PTT since it may be desirable to conserve power by turning the PLL off when not transmitting. This is one way of operating VCO 82; it may also be left enabled during periods of non-transmission where the VCO also controls the frequency of the receiver. Phase lock may also be lost by instabilities affecting the loop. These changes will often cause VCO 82 to generate for a time either its maximum or its minimum frequency, depending upon direction of the change. This may take an excessively long time to reach phase lock at a new frequency. The change is accomplished with greater speed by changing the divide ratio of divider 90. This is controlled by the level of the output voltage of operational amplifier 42 which is coupled through resistor 94 to operational amplifier 96 and through resistor 98 to operational amplifier 100. The signal taken through resistor 94 is connected to the positive input of operational amplifier 96 while that through resistor 98 is taken through the negative input of operational amplifier 100. Potentiometers 102 and 104 can be adjusted to set a window or predetermined range. When the signal at the output of operational amplifier 42 is within the window, the outputs of operational amplifiers 96 and 100 are a logic zero. These outputs are taken to PROM 106 which selects a divide number for programmable divider 90 that maintains frequency at a desired value. The two zero outputs are also applied to inverters 108 and 110, the outputs of which are combined and taken to NAND 112, then through capacitor 114 to monostable 48.

When the voltage at the output of operational amplifier 42 is outside the window determined by potentiometers 102 and 104, then one or the other of operational amplifiers 96 and 100 will generate a logic 1 as an output signal that will do two things. First, it will address another number stored in PROM 106 which is loaded as the divisor of divider 90. This changes the frequency on line 92 in a direction to cause it to approach the phase of the signal on line 36 more rapidly. The output of either operational amplifier 96 or 100 also generates an output through inverters 108 or 110, and 112, through capacitor 114 to trigger monostable 48 to switch adaptive filter 46 to a higher cutoff frequency. The combination of these two changes has the effect of reducing the time constant of the loop of FIG. 2. The circuit thus provides the divide ratio of divider 90 and a cutoff frequency of filter 46 that maintains an adequate level of sensitivity in the steady state, while also providing a slewing rate and a filter cutoff that increases the speed at which the loop settles following a change in frequency.

I claim:

1. A method of increasing speed of recovery of phase lock in a phase locked loop of a frequency synthesizer having an output signal comprising the steps of:
   sensing the difference in phase between a reference signal and another signal derived from said output signal;
   detecting if said difference is within a predetermined range, is less than said range, or is greater than said range; said phase locked loop not being in lock when said difference is either less than or greater than said range;
   changing a divisor of a frequency divider in the phase locked loop to a first number if said difference is less than said range; and
   changing said divisor to a second number different than said first number if said difference is greater than said range, said first and second numbers selected to cause said difference to rapidly come within said range thereby increasing the speed of recovery of phase lock.

2. The method according to claim 1 further comprising the step of increasing the bandwidth of a low-pass filter in the phase locked loop when said difference is less than said range and when said difference is greater than said range.

3. The method according to claim 1 wherein the changing of the divisor to said first number includes the step of selecting a predetermined first number not equal to a third number that determines the frequency of the output signal once phase lock is achieved.

4. The method according to claim 3 wherein the changing of the divisor to said second number includes the step of selecting a predetermined second number not equal to said third number that determines the frequency of the output signal once phase lock is achieved.

5. The method according to claim 4 further comprising the step of changing said divisor from one of said first and second numbers to said third number when said difference comes within said range.

6. The method according to claim 1 further comprising the step of changing said divisor from one of said first and second numbers to a third number not equal to either one of said first and second numbers when said difference comes within said range, said third number determining the frequency of the output signal once phase lock is achieved.

7. A frequency synthesizer having a phase locked loop adapted for fast recovery of phase lock comprising:
   a reference source;
   a phase detector connected to an output of the reference source to produce an output that is a measure of a phase difference;
   a low-pass filter connected to the phase detector to filter the output of the phase detector;
   a voltage-controlled oscillator connected to the low-pass filter, the filtered output of the phase detector connected as a control voltage to control the voltage-controlled oscillator;
   a frequency divider means for producing a divided output signal proportional to an output of said voltage-controlled oscillator, said divided output signal coupled to the phase detector for comparison with the output of the reference source to produce the measure of the phase difference; and
   means for controlling a divisor of said frequency divider means so that said divisor is a first number when said phase difference is less than a predetermined range, is a second number not equal to said first number when said phase difference is within said range, and is a third number not equal to said first or second numbers when said phase difference is greater than said range, said first and third numbers selected to cause said phase difference to rapidly come within said range, said phase locked loop not being in phase lock when said phase difference is less than and greater than said range.

8. The frequency synthesizer of claim 7 further comprising:
   means for changing parameters of the low-pass filter from one value when said phase difference is within said range to another value when said phase difference is outside of said range.

9. A frequency synthesizer having an output signal, adapted for increased speed of recovery of phase lock in a phase locked loop of the synthesizer comprising:
   means for sensing the difference in phase between a reference signal and other signal derived from said output signal;
   means for detecting if said difference is within a predetermined range, is less than said range, or is greater than said range, said phase locked loop not being in lock when said difference is either less than or greater than said range;
   means for changing a divisor of a frequency divider in the phase locked loop to a first number if said difference is less than said range; and
   means for changing said divisor to a second number different than said first number if said difference is greater than said range, said first and second numbers selected to cause said difference to rapidly come within said range thereby increasing the speed of recovery of phase lock.

10. The apparatus according to claim 9 further comprising means for increasing the bandwidth of a low-pass filter in the phase locked loop when said difference is less than said range and when said difference is greater than said range.

11. The apparatus according to claim 9 wherein said means for changing the divisor to a first number includes means for selecting a predetermined first number not equal to a third number that determines the frequency of the output signal once phase lock is achieved.

12. The apparatus according to claim 11 wherein the means for changing the divisor to said second number includes means for selecting a predetermined second number not equal to a third number that determines the frequency of the output signal once phase lock is achieved.

13. The apparatus according to claim 12 further comprising means for changing said divisor from one of said first and second numbers to said third number when said difference comes within said range.

14. The apparatus according to claim 9 further comprising means for changing said divisor from one of said first and second numbers to a third number not equal to either one of said first and second numbers when said difference comes within said range, said third number determining the frequency of the output signal once phase lock is achieved.

\* \* \* \* \*